US006534988B2

(12) United States Patent
Flory, IV

(10) Patent No.: US 6,534,988 B2
(45) Date of Patent: Mar. 18, 2003

(54) SYSTEM FOR TESTING THE PRESENCE OF AN IGNITOR PULSE WITHIN A HIGH INTENSITY DISCHARGE LUMINAIRE

(75) Inventor: Isaac L. Flory, IV, Blacksburg, VA (US)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 09/867,750

(22) Filed: May 31, 2001

(65) Prior Publication Data

US 2002/0190720 A1 Dec. 19, 2002

(51) Int. Cl.[7] .......................................... G01R 31/02
(52) U.S. Cl. .................................. 324/414; 315/129
(58) Field of Search ............................ 315/129, 289; 324/414, 508, 511

(56) References Cited

U.S. PATENT DOCUMENTS

| | | | | | |
|---|---|---|---|---|---|
| 4,318,031 | A | * | 3/1982 | Lonseth et al. ............. | 315/133 |
| 4,496,905 | A | | 1/1985 | Forte et al. ................. | 324/414 |
| 4,730,163 | A | | 3/1988 | Santos ........................ | 324/414 |
| 5,323,116 | A | | 6/1994 | Atria .......................... | 324/511 |
| 5,801,494 | A | * | 9/1998 | Herres et al. ............... | 315/119 |
| 6,087,834 | A | | 7/2000 | Tury et al. .................. | 324/414 |
| 6,127,782 | A | | 10/2000 | Flory, IV et al. ........... | 315/129 |

* cited by examiner

*Primary Examiner*—N. Le
*Assistant Examiner*—Vincent Q. Nguyen
(74) *Attorney, Agent, or Firm*—Aisha Ahmad; Mark S. Bicks; Alfred N. Goodman

(57) ABSTRACT

An ignitor monitoring device is provided which is enclosed within a housing to allow for portability while testing high intensity discharge (HID) luminaires. The device is placed in the lamp socket with the lamp removed, and measures the open circuit voltage across the ignitor, as well as the ignitor's ignition pulse. If the ignitor monitoring device detects adequate voltage to enable ignition of the lamp, the LED illuminates; otherwise, the LED fails to illuminate, and the operator can begin troubleshooting by replacing the ignitor and re-testing the luminaire, or testing the source, among other troubleshooting methods known in the art. A first housing employs a plunging mechanism that allows the operator to insert the monitoring device into the lamp socket with ample pressure to ensure electrical conduction between the device and the luminaire. A second housing employs a screw-in delivery system, similar to a conventional light bulb, to facilitate coupling and electrical conduction between the device and the luminaire.

43 Claims, 6 Drawing Sheets

SYSTEM FOR TESTING THE PRESENCE OF AN IGNITOR PULSE WITHIN A HIGH INTENSITY DISCHARGE LUMINAIRE

FIELD OF THE INVENTION

The present invention relates generally to an ignitor monitoring device disposed within a housing that is independent of the luminaire. More specifically, the invention provides for a device that tests for the presence of a hot re-strike ignitor pulse having a minimum threshold voltage.

BACKGROUND OF THE INVENTION

High intensity discharge luminaires, hereinafter referred to as HID luminaires, are commonly installed at high locations at commercial or industrial facilities such as on the ceiling of a warehouse or plant, or on light poles in a parking lot or stadium. HID luminaires can include, but are not limited to, metal halide (MH) lamps, and high pressure sodium (HPS) lamps. Some MH luminaires and all HPS luminaires use pulses from a high voltage source such as an ignitor circuit to ignite the lamp.

In many applications, the HID luminaires can be elevated on the order of thirty feet or more above the ground or floor of a commercial or industrial facility. The elevation of the luminaires makes repairs of malfunctioning luminaires inconvenient and time consuming since service personnel must ascend to considerable heights in order to gain access to the luminaires, assess the problem and then repair or replace the defective components of the luminaire. The malfunctioning of the HID can be attributable, for example, to a defective lamp starting circuit, also referred to as an ignitor. Specifically, if the ignitor does not produce a minimum threshold voltage, the lamp does not illuminate, thereby failing to establish initiation of the arc.

A number of devices exist to facilitate the assessment of a malfunctioning luminaire. For example, U.S. Pat. No. 4,496,905, to Forte et al., discloses an ignitor testing device with indicator lights to inform the user of various possibilities for luminaire failure. The device replaces the lamp in the luminaire housing, thus measuring the voltage provided across the lamp. In addition, the ignitor testing device employs a circuit with multiple elements in order to assess the positive and negative waveforms of the open circuit voltage signal. These multiple elements require a larger surface area on the circuit board and therefore a larger housing, which makes the device less portable. Thus, a need exists for an ignitor monitoring device that employs fewer elements in order to facilitate a smaller housing.

Further, the ignitor producing the open circuit voltage disclosed in U.S. Pat. No. 4,496,905 is not a hot re-strike ignitor, but rather a standard ignitor that is only able to re-strike after 45 seconds to 1.5 minutes, that is, only after sufficient time has elapsed for the lamp portion of the luminaire to cool down. Therefore, a need exists for an ignitor monitoring device that is able to test a hot re-strike ignitor yet maintain the portability function, as mentioned above. Such a hot re-strike ignitor is disclosed for example, in U.S. Pat. No. 5,047,694 to Nuckolls et al., and U.S. Pat. No. 5,321,338 to Nuckolls et al., the contents of both being incorporated herein by reference.

U.S. Pat. No. 6,127,782, to Flory, IV et al., also discloses an ignitor monitoring device that provides an indication of sufficient open circuit voltage to operate the ignitor. In contrast with the ignitor monitoring device disclosed in U.S. Pat. No. 4,496,905, the ignitor monitoring device disclosed in U.S. Pat. No. 6,127,782 is externally mountable to the luminaire housing. Thus, rather than replacing the lamp via a removable test housing, a receptacle that is distinct from the lamp socket, is provided to enable the ignitor monitoring device to be attached to the luminaire housing. Thus, each lamp has an attached and dedicated ignitor monitoring device. Accordingly, a need exists for a portable ignitor monitoring device with various delivery systems that can be readily coupled and uncoupled to different luminaires for troubleshooting purposes.

SUMMARY OF THE INVENTION

The present invention overcomes the deficiencies of existing ignitor monitoring devices and realizes a number of advantages over these devices. An ignitor monitoring device is provided in accordance with the present invention that is portable to enable testing of different lurninaires for the presence of an ignitor pulse via a pulse voltage associated with the lamp, therein. The ignitor monitoring device of the present invention is disposed on a circuit board within a housing that has two embodiments, for example, comprising a screw-in delivery housing and a plunger delivery housing.

The ignitor monitoring device of the present invention, for example, comprises a voltage threshold circuit, a gating circuit, an indicator device, a signal conditioning circuit, and a current discharge circuit. The voltage threshold circuit is operable to determine whether the pulse voltage is a minimnum threshold voltage, thereby indicating if the ignitor is striking at a sufficiently high voltage level to operate the lamp. The gating circuit is operable to conduct current when the open circuit voltage reaches the minimum threshold voltage, thereby allowing the indicator device to illuminate and indicate a sufficient ignitor pulse for lamp operation, as well as hot re-strike capability. The current discharge circuit is also operable to discharge residual current within the ignitor monitoring device. This discharge circuit is a safety feature to dissipate the residual charge on the circuit board within the housing thereby reducing the risk of exposing the user of the ignitor monitoring device to electrocution.

The present invention also provides a method for testing one of a plurality of luminaires for the presence of an ignitor pulse via a pulse voltage associated with the luminaires. The method comprises, first, determining whether the pulse voltage is a minimum threshold voltage and secondly, conducting current through a gating circuit such as an SCR when the pulse voltage is at the minimum threshold voltage. The method also comprises illuminating an LED in response to current flow indicating the ignitor is maintaining a minimum voltage pulse.

In accordance with an aspect of the present invention, the ignitor monitoring device is disposed on a circuit board within a housing that is external to the luminaire. In addition, the housing couples and decouples via a plunger device or a screw-in device, allowing for ease of use when testing.

In accordance with another aspect of the present invention, the ignitor monitoring device monitors the ignitor pulse on every positive one-half cycle of the waveform, thus allowing use of fewer components.

In accordance with another aspect of the present invention, the ignitor monitoring device is provided for use with a hot re-strike ignitor, as opposed to a conventional HID lamp ignitor requiring a cool down period before re-striking can occur.

BRIEF DESCRIPTION OF THE DRAWINGS

These and other aspects, advantages and novel features of the invention will be more readily appreciated from the following detailed description when read in conjunction with the accompanying drawings, in which.

DETAILED DESCRIPTION OF THE PREFERRED EMBODIMENTS

Figure 1:
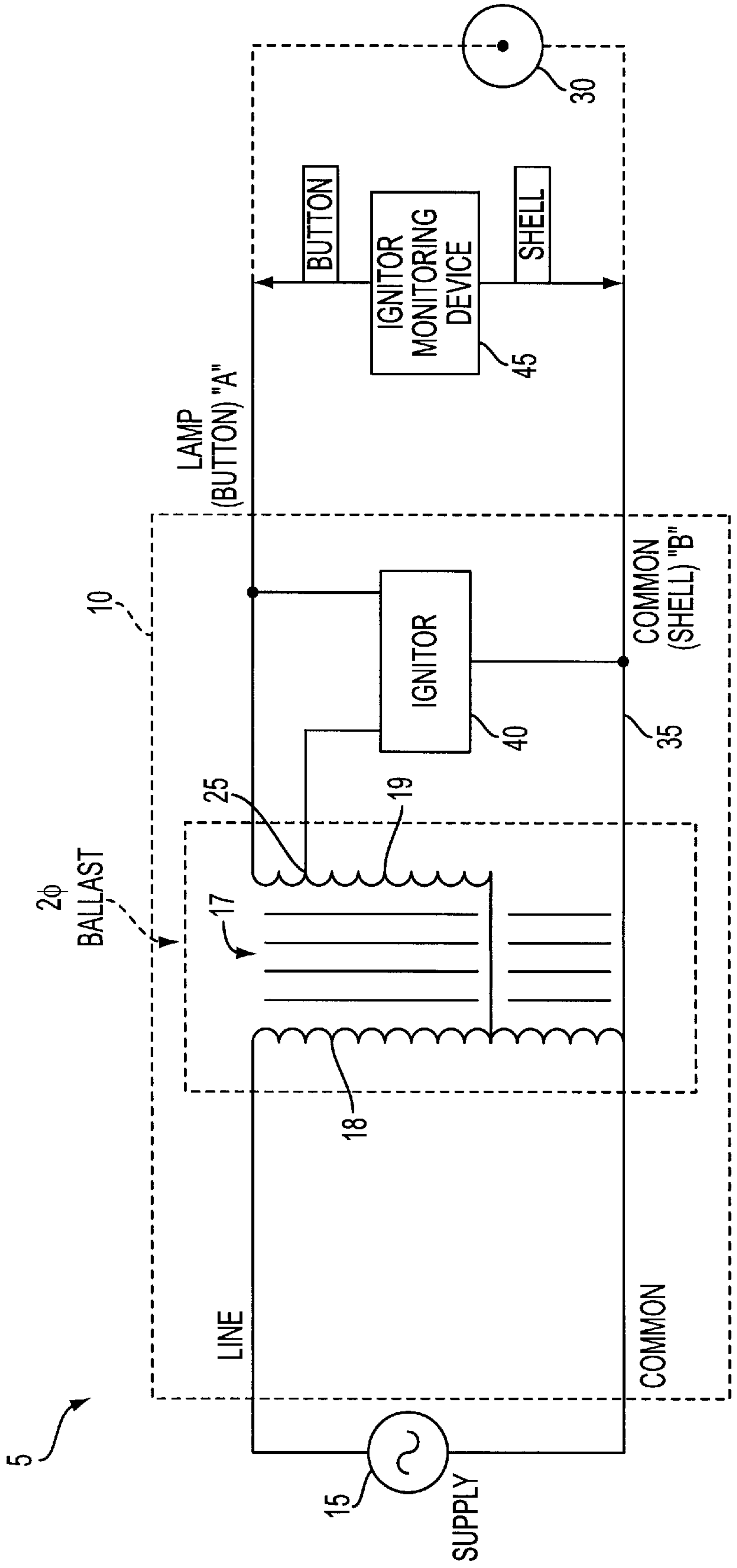
FIG. 1 is a schematic diagram depicting an ignitor monitoring device coupled to the luminaire constructed in accordance with an embodiment of the present invention.

FIG. 1 depicts an assembly 5 comprising a High Intensity Discharge (HID) luminaire 10 coupled to an ignitor monitoring device 45 constructed in accordance with a preferred embodiment of the present invention. The lamp 30 that is typically associated with the luminaire 30 is shown in phantom to illustrate use of the ignitor monitoring device 45 of the present invention. An AC source 15 is connected across the primary winding 18 of the lamp ballast 20 and the HID lamp 30 in a conventional manner. The ignitor monitoring device 45 is connected across the secondary winding 19, thereby allowing the device 45 to measure an open circuit voltage across a lamp 30 as provided by ballast 20. This operation is discussed in further detail below.

The ballast 20 of FIG. 1 provides the step-up transformation of voltage for the ignitor 40. The ballast 20 and the HID lamp 30 are in a series circuit relationship with one another across the AC power source 15. The primary winding 18 and the secondary winding 19 are inductively coupled via the steel core 17. As is readily apparent to one skilled in the art, the primary winding 18 has a greater number of turns than secondary winding 19. A tap 25 is provided at a point in the winding 18 and the secondary winding 19, which is preferably on the order of about 5% of the total number of turns of the primary winding 18.

The ignitor 40 is connected to the lamp 30, the ballast 20 and common 35 in a conventional manner. In addition, the ignitor 40 is preferably a hot re-strike ignitor, thus allowing the ignitor 40 to re-strike a hot de-ionized lamp 30 on the order of about three seconds. This is in contrast to a conventional ignitor which can require as many as 1.5 seconds to elapse between ignition pulses in order to allow the circuitry to dissipate excess heat.

Figure 3:
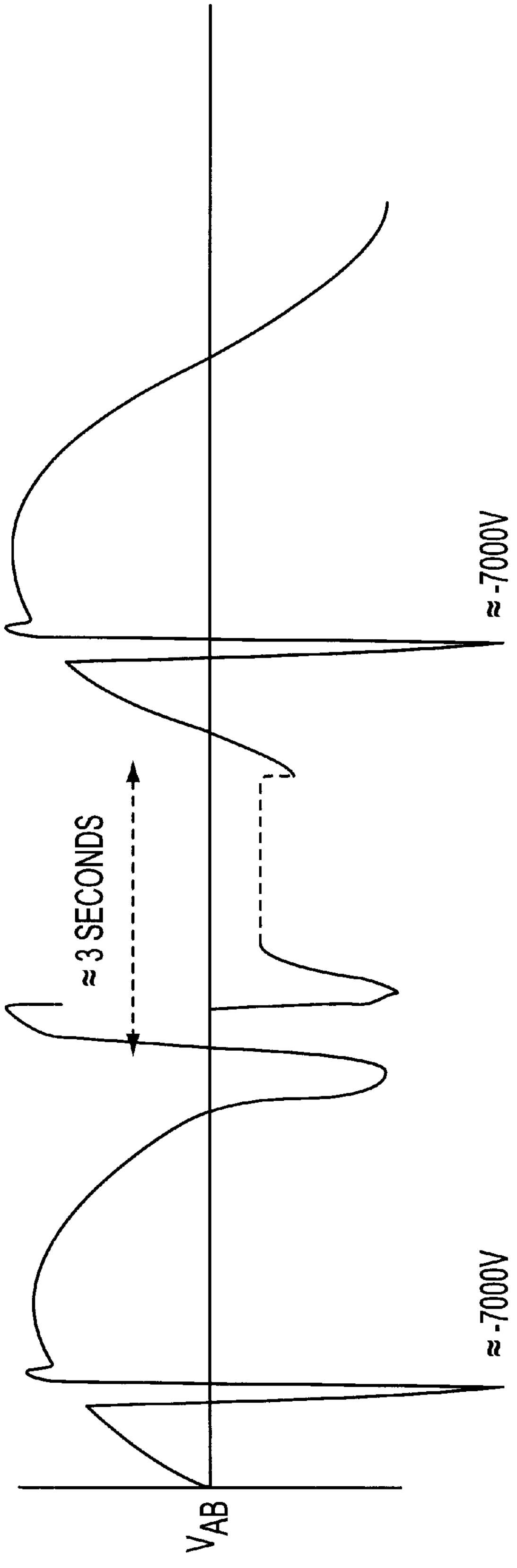
FIG. 3 is a timing diagram illustrating the voltage threshold of the ignitor of FIG. 2 within an HID luminaire.

As is discussed in further detail below, the ignitor monitoring device 45 can be disposed in various housings to provide for a compact and portable test device. This compact size and portability are important features of the present invention since the HID luminaires 10 are typically elevated on the order of about thirty feet or more above ground level. In addition, the ignitor monitoring device 45 comprises an LED that illuminates when the ignitor pulse, as depicted in FIG. 3 and described herein, is adequate to ignite the lamp 30. This allows for rapid assessment of the ignitor status.

Figure 2:
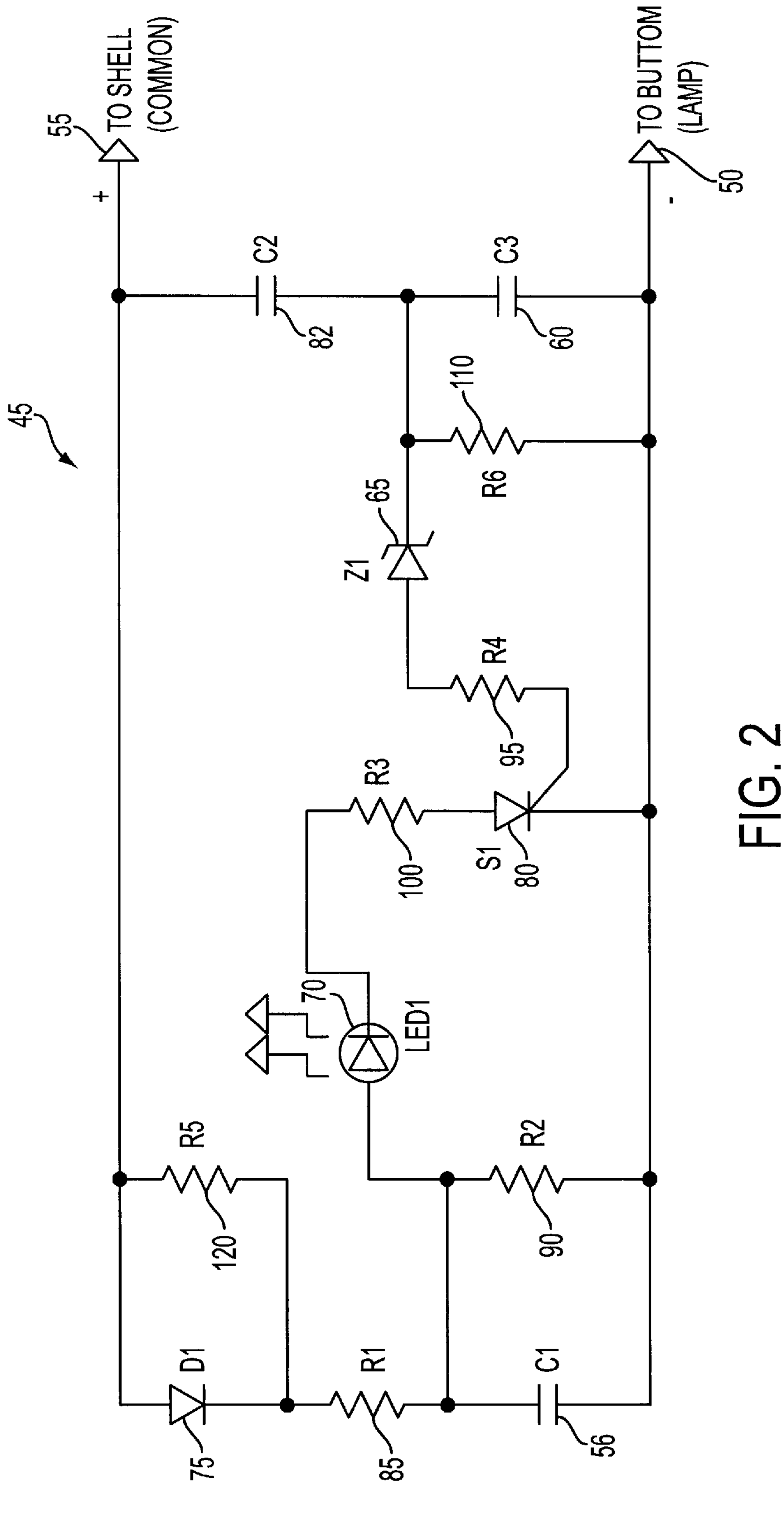
FIG. 2 is a schematic diagram of an ignitor monitoring device constructed in accordance with an embodiment of the present invention.

Referring now to FIG. 2, which depicts a detailed schematic of the ignitor monitoring device 45 of FIG. 1, the device 45 is enclosed within a portable housing, described below, and is preferably coupled to the lamp terminals 50 and 55 with the lamp removed from the energized ballast 20. The negative terminal 50 of the device 45 is coupled to the line connection for the lamp 30, and the positive terminal 55 of the device 45 is coupled to the common 35 or neutral connection of the lamp 30, thus creating an overall reverse polarity characteristic to the device 45. Capacitor 60 is charged via the ignitor pulse shown in FIG. 3 with this reverse polarity to ensure sufficient voltage to overcome the voltage threshold of zener diode 65, whose operation is further discussed below. Capacitor 56 is also charged via the 60 HZ AC source 15 to act as an energy source for the illumination of LED 70. Diode 75 is a half-wave bridge to ensure consistent polarity as required by the LED 70. The reverse polarity ensures activation of LED 70, which requires conduction in only one direction. As is known to those skilled in the art, an LED provides for current flow from anode to cathode in a unidirectional fashion. Thus, when a forward voltage is applied, the LED conducts, and when a reverse voltage is applied, conduction ceases or reverse breakdown occurs. Thus, the reverse polarity assists in achieving the adequate required breakdown voltage of zener diode 65, as well as ensuring sufficient current loop energy for illumination of the LED 70.

Capacitor 60 and capacitor 82 function as a voltage divider to distinguish between ignitor pulses of sufficient voltage and ignitor pulses lacking sufficient voltage. Accordingly, capacitor 60 facilitates throughput of sufficient voltage ignitor pulses, as shown in FIG. 3. The SCR 80 operates in a conventional manner. For example, the SCR 80 is controlled from an off state to an on state via a third terminal or gate. Thus, once the SCR is turned on, it conducts even after removal of the gate signal, as long as a minimum holding current is maintained in the rectified circuit. Therefore, the current flows through SCR 80 and LED 70, since the anodes and cathodes of these two components are in similar directions, to ensure the correct polarity.

In a preferred embodiment of the present invention, a signal conditioning circuit is preferably provided comprising diode 75, resistor 85, and capacitor 56, wherein capacitor 56 is charged every other half-cycle through diode 75 and resistor 85. The current path continues through resistor 90 which preferably employs capacitor 56 to limit the stored energy, as well as to provide a discharge path when the testing device 45 is removed from the lamp socket.

During operation of the ignitor monitoring device 45, which is placed in the lamp socket in place of the lamp 30, the device 45 measures a voltage resulting from the ignitor pulse of the ignitor 40. As shown in FIG. 3, if the ignitor is functioning properly, it outputs a voltage level on the order of about 7000 Volts to provide adequate ignition energy for the lamp 30. An embodiment of the present invention employs a hot re-strike ignitor, thereby allowing the ignitor to operate every three to five seconds until the lamp is turned on. Accordingly, zener diode 65 conducts upon application of sufficient voltage, as preferably provided by the energy stored in capacitor 60. Current conducts through resistor 95, providing sufficient current to gate SCR 80. Upon conduction of SCR 80, capacitor 56 discharges via LED 70 and resistor 100. This current flow allows LED 70 to illuminate if the ignitor pulse voltage is on the order of about 7000 V, thus indicating an adequate ignitor pulse for ignition of the lamp 30. Therefore, when the operator places the ignitor device 45 within the luminaire 10 and the LED 70 illuminates, the operator knows the ignitor is functioning properly. However, if the LED 70 fails to illuminate, the operator can begin troubleshooting by replacing the ignitor 40, or checking condition of the supply 15.

To prevent the risk of shock when the user is removing the ignitor monitoring device 45 from the lamp socket, various components are employed to discharge any residual stored energy. Specifically, resistor 110 is preferably employed to provide an adequate discharge path for capacitor 60. In addition, capacitor 82 discharges through resistors 85, 90, 110, and 120.

Illustrative values for the resistors 85 and 90, along with all the components of the ignitor monitoring device are detailed in Table 1 below.

| | |
|---|---|
| capacitor 56 | 5.6 mf |
| capacitor 60 | 0.1 mf |
| capacitor 82 | 250 pf |
| resistor 85 | 270 Kohms |
| resistor 90 | 6.8 Mohms |
| resistor 95 | 360 ohms |
| resistor 100 | 2.2 Kohms |
| resistor 110 | 2.7 Mohms |
| resistor 120 | 10 Mohms |
| Diode 75 | CPO2-40 (4 kV) |
| Zener Diode 65 | 100 V |
| SCR 80 | S6025 (600 V, 25 A |
| LED 70 | HPWAMH |

Figure 4:
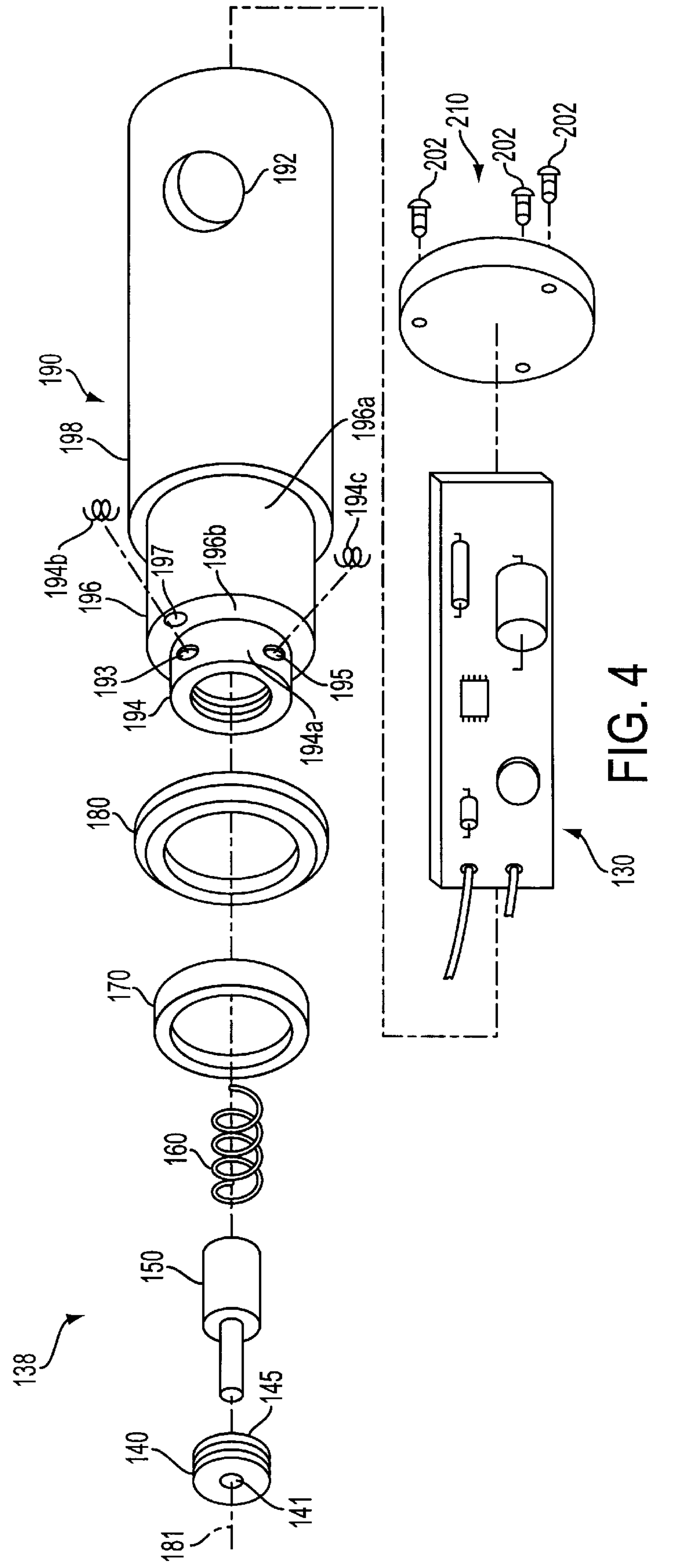
FIG. 4 is an exploded perspective view of an ignitor monitoring device and its housing constructed in accordance with an embodiment of the present invention.

The ignitor monitoring device 45 is preferably located on a circuit board which is further disposed within an assembly 138. FIG. 4 depicts an exploded view of the circuit board 130 within an assembly 138 constructed in accordance with a preferred embodiment of the present invention. The assembly 138 comprises the removable circuit board 130 which embodies the schematic of FIG. 2, a substantially cylindrical threaded end cap 140, located at a first end coupled to a metal ring 145, a plunger device 150, a flexible metal spring 160, a substantially cylindrical plastic ring 170, an arcuate metal conductive ring 180, a plastic substantially cylindrical housing 190, and a plastic first end cap 210 located proximate to the circuit board and distal to the substantially cylindrical second end cap 140.

The substantially cylindrical housing 190 is composed of a hard plastic with, for example, three levels of grading at the end distal to the substantially cylindrical end cap 140. The first grading level 194 is substantially cylindrical and has an outer surface 194*a*. Surface 194*a* comprises two arcuate holes 193 and 195, and are adapted to receive two small springs 194*b* and 194*c*, respectively, spring 194*b* is adapted to provide the circuit board 130 with adequate electrical connection to test the luminaire 10, via conductive ring 180. The next grading level 196 is substantially cylindrical and has a diameter larger than grading 194. Furthermore, level 196 has an outer surface 196*a* and an end surface 196*b*. However, grading 196 has only one hole 197 in end surface 196*b* to facilitate an electrical connection for the circuit board 130. Hole 196 is adjacent hole 193 and allows an electrical wire to extend from circuit board 130 in the interior of assembly 138 through interior channel 130*a* (FIG. 5) and couple to spring 194*b*. The last grading level 198, proximate to the second end cap 210, contains a hole 192 that can allow access to the circuit board 130 for testing equipment (not shown) if desired, when not in use a screw can be inserted into hole 192 to ensure circuit board 130 stability. The end cap 210 is also provided to ensure the circuit board 130 stability, but also to maintain an enclosed environment for the circuit board 130 to prevent wear and tear. The end cap 210 has three screws 202 to secure the end cap 210 on the housing 190.

Figure 5:
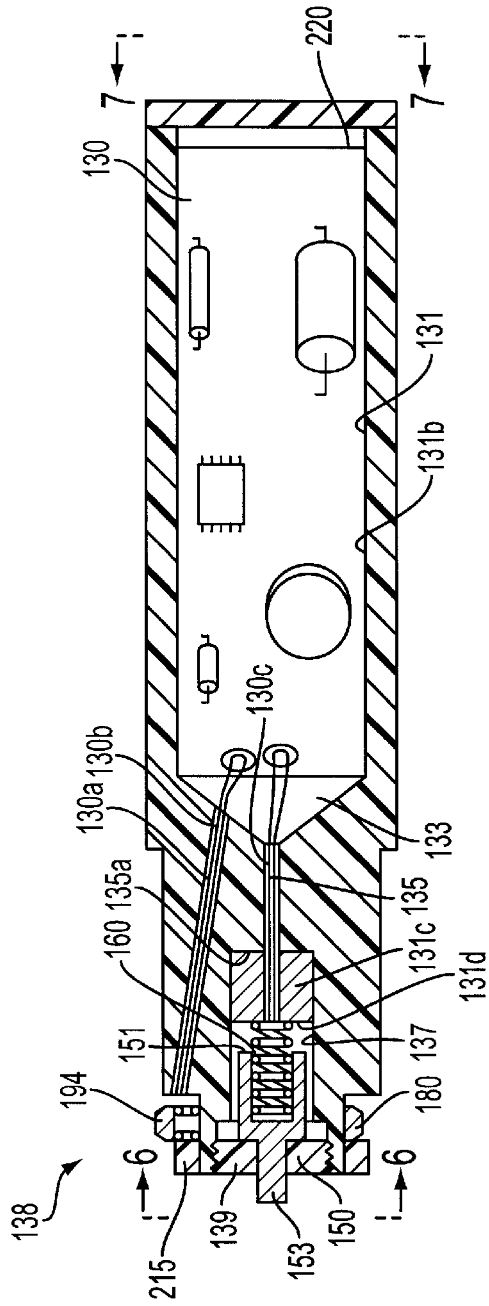
FIG. 5 is a cross-sectional side view of a plug-in ignitor monitoring device disposed on a circuit board within a housing constructed in accordance with an embodiment of the present invention.

Referring now to FIG. 5, which depicts a cross-sectional view of the assembly 138. For clarity, the cross-section does not reflect all of the detail of FIG. 4. Assembly 138 has a substantially cylindrical interior channel 131 defined by surface 131*b* that is adapted to hold circuit board 130. Channel 131 opens to first end 220 for insertion of board 130 thereto. Channel 131 has a frustoconical surface 133 that is adjacent interior surface 135. Interior surface 135 is then adjacent substantially cylindrical surface 137. Surface 137 has a diameter that is larger then surface 135 and the difference in diameter forms surface 135*a*. Surface 137 is adjacent threaded opening 139, which opens to second end 215. Channel 130*a* extends from frustoconical surface 133 to surface 196*b* as described above.

Circuit board 130 fits into open end 131*a* and is preferably frictionally held by surface 131*b*. However, board 130 can be held in channel 131 by any means desired, such as slots or adhesive. Two wires 130*b* and 130*c* extend from board 130 through channel 130*a* and through channel 131 to second end 215. A substantially cylindrical metal block 131*c* having a passage way therethrough and an end surface 131*d* fits into passageway 131 and abuts surface 135*a*. Spring 160 can be inserted into channel 131 and abuts end 131*d* of block 131*c*. The wire 130 couples to spring 160. Plunger 150 is then inserted into channel 131 and spring 160 is inserted into open end 151 of plunger 150. End cap 140 is then inserted into second open end 215 and screwed thereinto. Contact portion 153 extends through hole 141 in end cap 140. The plunger 150 is preferably metal, which allows electrical connection from circuit board 130 through wire 131*c* to plunger 150.

Ring 180 is large enough to fit around level 194 and is biased off center from main longitudinal axis 181 by springs 194*b* and 194*c*. Ring 180 is held onto level 194 by ring 170 which is sized to frictionally engage surface 194*c*.

In operation, second end 215 of assembly 138 is inserted into the lamp socket of the luminaire 10, with the lamp 30 removed, contact portion 153 of plunger 151 provides an electrical connection with spring 160 provided to facilitate and maintain connection. In addition, ring 180 provides an electrical connection between the side of assembly 138 and the lamp socket. Springs 194*b* and 194*a* biases ring 180 off center from the main longitudinal axis 181 to facilitate electrical conduction.

Figure 6:
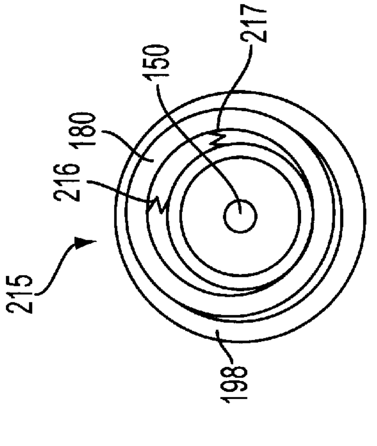
FIG. 6 depicts the front end of the -housing enclosing the ignitor monitoring device taken along lines 6—6 of FIG. 5 and constructed in accordance with an embodiment of the present invention.

FIG. 6 depicts a plastic front end 215 wherein, the plunger 150 makes electrical connection with the luminaire 10 at terminal 50. The springs 217 and 216 are provided to offset the metal ring 180 from the main axis 181 of the housing 190, thus facilitating an electrical connection between the circuit board 130 and the luminaire 10 at terminal 55. The shape of the front end 215 is substantially cylindrical and is composed of an impermeable, hard plastic.

Figure 7:
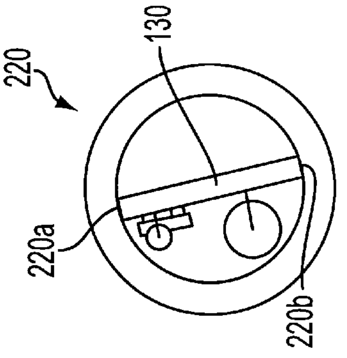
FIG. 7 illustrates the back end of the housing depicting the ignitor monitoring device taken along lines 7—7 of FIG. 5 and constructed in accordance with an embodiment of the present invention.

FIG. 7 depicts the second end 220 located distal to the front end 215 as shown in FIG. 6. The second end is illustrated upon removal of the end cap 210 For illustrative purposes, the circuit board 130 is shown in position as if a luminaire 10 is being tested. Additionally, the circuit board 130 is seated by frictional means between sides 220*a* and 220*b*. This allows for simple insertion and removal of the circuit board in case of repair or storage, among other reasons. However, the circuit board 130 may be mounted within the housing by any means known in the art.

Figure 9:
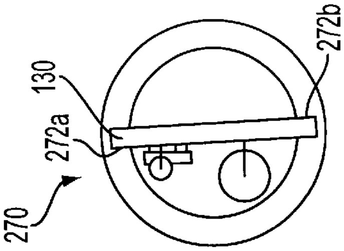
FIG. 9 depicts a top view of the threaded housing taken along lines 9—9 of FIG. 8 and constructed in accordance with a second embodiment of the housing of the present invention.
Figure 8:
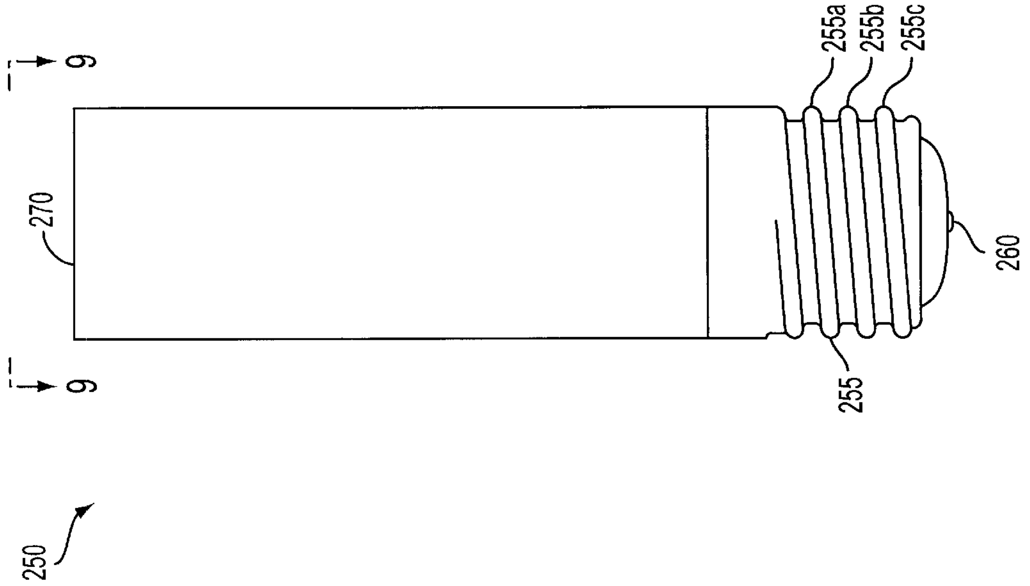
FIG. 8 illustrates a threaded housing for an ignitor monitoring device constructed in accordance with a first embodiment of the housing of the present invention.

FIGS. 8 and 9 disclose a second embodiment 250 of the housing employed to enclose circuit board 130, for ignitor testing purposes. An electrical connection is provided at terminal 260 to facilitate a connection between circuit 130 and the luminaire 10. Threaded surface 255 assists in providing an additional electrical connection, via the metal threads 255*a–c*. The threaded surface 255 is attached in a conventional manner similar to a light bulb, to luminaire 10 within the lamp socket, with the lamp 30 removed.

FIG. 9 depicts a top end 270 of FIG. 8 distal to the threaded surface 255. The circuit board 130 is shown, for illustrative purposes, fixed by means of slots 272*a* and 272*b*, however slots 272*a* and 272*b* are not the only means for attachment of circuit board 130 to housing 250. For example, the circuit board 130 can be secured by frictional forces, adhesive or any other method known in the art.

Although only several exemplary embodiments of the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. An ignitor monitoring device for testing one of a plurality of luminaires for the presence of an ignitor pulse via an open circuit voltage associated with said luminaires, wherein said ignitor monitoring device is disposed on a circuit board, said monitoring device comprising:

a voltage threshold circuit, operable to determine whether said open circuit voltage is of a magnitude to provide a selected threshold voltage;

a discharge circuit, operable to conduct current when said open circuit voltage is said selected threshold voltage;

an indicator device operable to indicate when said voltage threshold circuit detects said selected threshold voltage, in response to said conducting current at said gating device;

a signal conditioning circuit, operable to maintain and conduct current flow to said indicator device; and a energy discharge circuit, operable to discharge residual energy within said ignitor monitoring device.

2. An ignitor monitoring device, as claimed in claim 1, wherein said ignitor monitoring device is disposed in a portable test housing and said indicator device is visible externally therefrom and adapted to be substituted for said lamp in a luminaire socket.

3. An ignitor monitoring device, as claimed in claim 1, wherein said signal conditioning circuit comprising:

at least one diode, resistor, and capacitor;

at least one diode and resistor.

4. An ignitor monitoring device, as claimed in claim 1, wherein said current discharge circuit comprising a plurality of resistors.

5. An ignitor monitoring device as claimed in claim 1, wherein said selected threshold voltage is a predetermined portion of the open circuit voltage.

6. An ignitor monitoring device as claimed in claim 5, wherein said minimum threshold voltage is 100 Volts.

7. An ignitor monitoring device as claimed in claim 1, wherein said voltage threshold circuit comprises a zener diode.

8. An ignitor monitoring device as claimed in claim 1, wherein said discharge circuit includes a silicon controlled rectifier (SCR).

9. The device of claim 1, wherein said circuit board is inserted into at least one slot in said housing.

10. The device of claim 1, wherein said circuit board is located within a substantially cylindrical housing having a central longitudinal axis.

11. The device of claim 10, wherein said housing has a first open end and a second open end.

12. The device of claim 11, wherein said circuit board is inserted into said second open end.

13. The device of claim 11, further comprising a contact member, wherein said contact member is located at least partially in said first opening.

14. The device of claim 13, further comprising a substantially arcuate conducting member proximate to said first end.

15. The device of claim 14, wherein said substantially arcuate conducting member is a substantially circular ring that surrounds said first end of said housing.

16. The device of claim 15, wherein said substantially arcuate conducting member is offset from said central long axis of said housing.

17. The device of claim 16, wherein said substantially arcuate conducting member is offset by a third member.

18. The device of claim 17, wherein said third member comprising a spring.

19. An ignitor monitoring method for testing one of a plurality of luminaires for the presence of an ignitor pulse via an open circuit voltage associated with said luminaires, said monitoring method comprising the steps of:

determining whether said open circuit voltage gives rise to a selected threshold voltage using a voltage divider;

conducting current through a gating circuit when said open circuit voltage gives rise to said selected threshold voltage; and generating an indicator signal in response to achieving said selected threshold voltage.

20. An ignitor monitoring device for testing one of a plurality of luminaires for the presence of an ignitor pulse via an open circuit voltage associated with said luminaire, wherein said monitoring device is disposed on a circuit board, said monitoring device comprising:

at least one capacitive device disposed between a positive and negative coupling to a lamp;

a signal conditioning circuit connected in parallel to said at least one capacitive device wherein said signal conditioning circuit is in parallel with said at least one capacitive device and said open circuit voltage;

a first resistive device coupled in parallel to said at least one capacitive device;

a gating circuit;

a series circuit comprising a rectifying device and a resistive device coupled serially between said gating circuit and said first resistive device; and an indicator disposed between and serially coupled to said gating circuit and said signal conditioning circuit, when said open circuit voltage is applied, said indicator indicates when said open circuit voltage gives rise to a selected threshold voltage thereby initiating a conductive path comprising said gating circuit and said signal conditioning circuit.

21. An ignitor monitoring device as claimed in claim 20, wherein said signal conditioning circuit comprising:

a diode device;

a resistive device; and a capacitive device.

22. The device of claim 20, wherein said circuit board is inserted into at least one slot in said housing.

23. The device of claim 20, wherein said circuit board is located within a substantially cylindrical housing having a central longitudinal axis.

24. The device of claim 23, wherein said housing has a first open end and a second open end.

25. The device of claim 24, wherein said circuit board is inserted into said second open end.

26. The device of claim 24, further comprising a contact member, wherein said contact member is located at least partially in said first opening.

27. The device of claim 26, further comprising a substantially arcuate conducting member proximate to said first end.

28. The device of claim 27, wherein said substantially arcuate conducting member is a substantially circular ring that surrounds said first end of said housing.

29. The device of claim 28, wherein said substantially arcuate conducting member is offset from said central long axis of said housing.

30. The device of claim 29, wherein said substantially arcuate conducting member is offset by a third member.

31. The device of claim 30, wherein said third member comprising a spring.

32. An ignitor monitoring device for testing one of a plurality of luminaires for the presence of an ignitor pulse via an open circuit voltage associated with said luminaires, wherein said monitoring device is disposed on a circuit board, said monitoring device comprising:

a voltage threshold circuit, operable to determine whether said open circuit voltage is of a magnitude to provide a selected threshold voltage;

a discharge circuit, operable to conduct current when said open circuit voltage is said selected threshold voltage;

an indicator device operable to indicate when said voltage threshold circuit detects said selected threshold voltage, in response to said conducting current at said gating device;

a signal conditioning circuit, operable to maintain and conduct current flow to said indicator device;

an energy discharge circuit, operable to discharge residual energy within said ignitor monitoring device; and a circuit board for securing said voltage threshold circuit, discharge circuit, indicator device, signal conditioning circuit, and energy discharge circuit, said circuit board located within a substantially cylindrical housing having a central longitudinal axis, said housing having a first and second open end, and a contact member, said contact member located at least partially in said first open end and said circuit board inserted into said second open end of said housing.

33. The device of claim 32, further comprising a substantially arcurate conducting member proximate to said first end.

34. The device of claim 33, wherein said substantially arcuate conducting member is a substantially circular ring that surrounds said first end of said housing.

35. The device of claim 34, wherein said substantially arcuate conducting member is offset from said central long axis of said housing.

36. The device of claim 35, wherein said substantially arcuate conducting member is offset by a third member.

37. The device of claim 36, wherein said third member comprising a spring.

38. An ignitor monitoring device for testing one of a plurality of luminaires for the presence of an ignitor pulse via an open circuit voltage associated with said luminaire, wherein said monitoring device is disposed on a circuit board, said monitoring device comprising:

at least one capacitive device disposed between a positive and negative coupling to a lamp;

a signal conditioning circuit connected in parallel to said at least one capacitive device wherein said signal conditioning circuit is in parallel with said at least one capacitive device and said open circuit voltage;

a first resistive device coupled in parallel to said at least one capacitive device;

a gating circuit;

a series circuit comprising a rectifying device and a resistive device coupled serially between said gating circuit and said first resistive device;

an indicator disposed between and serially coupled to said gating circuit and said signal conditioning circuit, when said open circuit voltage is applied, said indicator indicates when said open circuit voltage gives rise to a selected threshold voltage thereby initiating a conductive path comprising said gating circuit and said signal conditioning circuit; and a circuit board for securing said at least one capacitive device, signal conditioning circuit, first resistive device, gating circuit, series circuit and indicator, said circuit board located within a substantially cylindrical housing having a central longitudinal axis, said housing having a first and second open end, and a contact member, said contact member located at least partially in said first open end and said circuit board inserted into said second open end of said housing.

39. The device of claim 38, further comprising a substantially arcurate conducting member proximate to said first end.

40. The device of claim 39, wherein said substantially arcuate conducting member is a substantially circular ring that surrounds said first end of said housing.

41. The device of claim 40, wherein said substantially arcuate conducting member is offset from said central long axis of said housing.

42. The device of claim 41, wherein said substantially arcuate conducting member is offset by a third member .

43. The device of claim 42, wherein said third member comprising a spring.

* * * * *